United States Patent [19]

Troutman et al.

[11] 4,001,553
[45] Jan. 4, 1977

[54] COUNTER ARRANGEMENT AND ASSOCIATED TEST CIRCUIT FOR AN ELECTRONIC TIMING DEVICE

[75] Inventors: Bruce L. Troutman, Long Beach; Emory N. Yount, Fullerton, both of Calif.

[73] Assignee: Rockwell International Corporation, El Segundo, Calif.

[22] Filed: Sept. 17, 1975

[21] Appl. No.: 614,106

[52] U.S. Cl. .................. 235/92 MS; 235/92 T; 235/92 R; 58/23 R
[51] Int. Cl.² ...................................... H03K 21/30
[58] Field of Search ......... 235/92 T, 92 PL, 92 EC, 235/92 FP, 92 MS, 92 GT, 92 DE; 73/6; 58/23 R, 23 AC, 23 A

[56] References Cited

UNITED STATES PATENTS

| | | | |
|---|---|---|---|
| 3,733,810 | 5/1973 | Girard | 58/23 R |
| 3,746,843 | 7/1973 | Wesner | 235/92 R |
| 3,855,782 | 12/1974 | Nishimura et al. | 58/23 R |

*Primary Examiner*—Joseph M. Thesz
*Attorney, Agent, or Firm*—H. Fredrick Hamann; G. Donald Weber, Jr.; Morland Charles Fischer

[57] ABSTRACT

A unique one chip counter arrangement and high-speed test circuit for an electronic timing device, such as a digital watch or clock. The counter arrangement is comprised of a plurality of separate divider stages interconnected with respect to one another in order to be rapidly tested in either a test mode or to be operated in a normal mode of operation by a minimum number of components which consume a relatively small amount of space.

10 Claims, 1 Drawing Figure

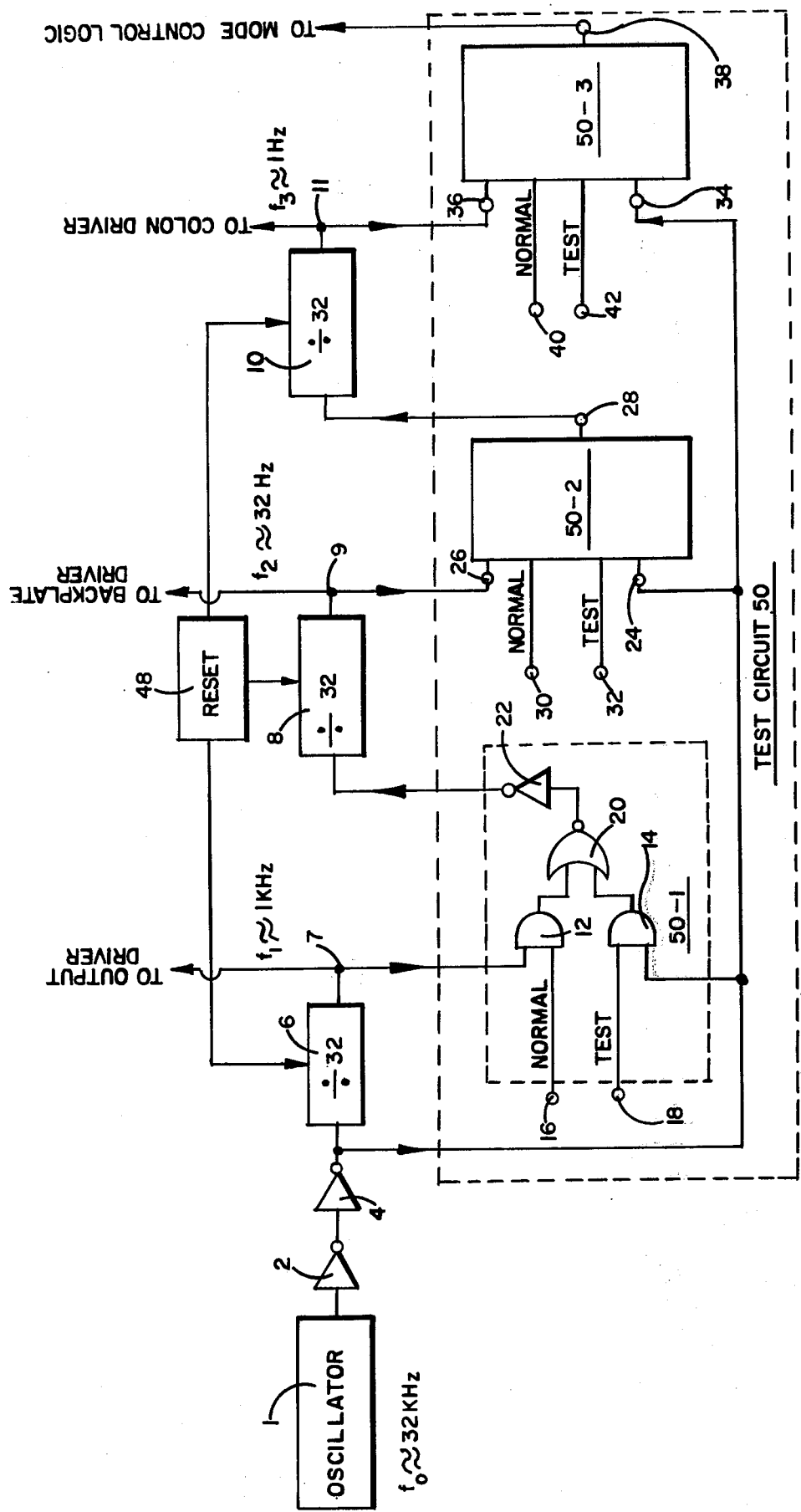

COUNTER ARRANGEMENT AND ASSOCIATED TEST CIRCUIT FOR AN ELECTRONIC TIMING DEVICE

BACKGROUND OF THE INVENTION

1. Field of the Invention

This invention relates to an electronic timing device and more particularly to a unique counter arrangement and an associated high speed test circuit to be disposed upon a single semiconductor chip.

2. Prior Art

Conventional counting techniques for an electronic digital timing device include a single main counter to be driven by an oscillator which generally provides an input signal having a frequency of 32,768 Hz. Therefore, the main counter of the prior art is required to divide the oscillator input signal by a factor of 32,768 before a usable 1 Hz. signal can be obtained. In order to either test or to normally operate the main counter of the prior art, the counter is first required to be cycled through 32,768 clock pulses. This technique substantially slows down the testing of the counter so as to make testing thereof relatively impractical. One example of a prior art arrangement can be found in U.S. Pat. No. 3,889,459, issued June 17, 1975.

What is more, the circuitry that is required to perform the test of the prior art counter is relatively large, thereby resulting in the necessity for a plurality of test pads as well as an uneconomical utilization of space on a semiconductor chip or chips.

SUMMARY OF THE INVENTION

Briefly, and in general terms, a one chip counter arrangement and an associated high-speed test circuit for an electronic timing device are disclosed. The counter is comprised, in a preferred embodiment, of a plurality of separate divider stages interconnected with one another in a series string.

The test circuitry is connected to selectively operate the counter arrangement in either a high speed TEST mode of operation or in a NORMAL mode of operation. During the TEST mode, each of the counter stages is operated in parallel by a high speed clock input signal provided by a suitable oscillator amplifier. Detection means are provided to monitor the output signals from each counter stage to determine whether each counter stage is functioning properly and according to a predetermined output.

During the NORMAL mode of operation, when it is desirable to operate the timing device for its intended purpose, the high speed test clock input signal is selectively disconnected from all but the first counter stage by the instant test circuit. Output signals from each respective counter stage are used to operate the succeeding counter stage in series. Therefore, during the NORMAL mode, the instant counter arrangement functions as the equivalent of a single counter stage to divide the high-speed clock input signal driving the first counter stage down to a utilizable frequency (e.g. 1 Hz).

BRIEF DESCRIPTION OF THE DRAWINGS

The sole FIGURE of the drawings illustrates the unique counter arrangement and the associated high speed test circuitry of the instant invention.

DESCRIPTION OF THE PREFERRED EMBODIMENT

Referring to the sole FIGURE, the counter arrangement and high-speed test circuit of the instant invention are illustrated. Such a counter and test circuit may be usefully disposed on a single semiconductor chip. Such a chip array may be utilized in electronic timing devices (such as a watch, a clock and the like) having a digital readout display (e.g. such as a liquid crystal display). The test circuit 50 may be comprised of any convenient arrangement of logic or transmission gates. That circuit which is shown is for exemplary purposes only. In accordance with the instant invention, the conventional structure of a single 32,768 Hz. main counter common in the prior art is separated into a plurality of counter stages. For convenience, a series connected string of three separate counter stages 6, 8 and 10 is shown. However, it is to be understood that any conveniently interconnected plurality of counter stages may be employed within the scope of the invention.

A suitable oscillator 1 (e.g. any well-known crystal oscillator amplifier) is connected to counter stages 6, 8 and 10 and test circuit 50 and provides a high speed clock input signal having a frequency of 32,768 Hz. The clock input signal may optionally be conducted through amplifier-inverter gates 2 and 4, to an input terminal of the first counter stage 6. Gates 2 and 4 may be utilized, if desired, in order to minimize the effects of loading at the output of oscillator 1 and to provide a supply of suitably shaped clock signals. Counter stage 6 is, in a preferred embodiment, a divide-by-32 counter. The output signal from first counter stage 6 has a frequency which is equivalent to that of the clock input signal divided down by a factor of 32 to 1024 Hz. The 1024 Hz. output signal is supplied to portion 50-1 of test circuit 50 and to a first input terminal of AND gate 12. The high speed clock input signal is also supplied to a first input terminal of AND gate 14 of test circuit portion 50-1. A source (not shown) of logic level (e.g. binary) control signals is selectively connected to a TEST input terminal 18 of AND gate 14. The source of logic level control signals is also selectively connected to a NORMAL or non-test input terminal 16 of AND gage 12. The source is adapted to concurrently apply complementary logic level control signals to NORMAL input terminal 16 and to TEST input terminal 18. The respective logic levels of the complementary control signals applied to terminals 16 and 18 are dependent upon whether it is desirable to test the counter assembly or to activate the counter in its normal mode of operation, as will be explained in greater detail hereinafter. The source of the complementary control signals connected to terminals 16 and 18 may be externally disposed with respect to the semiconductor chip containing oscillator 1, counter stages 6, 8 and 10 and test circuit 50. The output signals of AND gates 12 and 14 are supplied to first and second input terminals of a 2-input NOR gate 20. The output signals from NOR gate 20 are conducted through amplifier-inverter gate 22 to an input terminal of the second counter stage 8. It is to be understood, however, that NOR gate 20 and amplifier-inverter gate 22 may be replaced by a suitable OR gate, inasmuch as the logic level of an output signal from an OR gate is identical with that of a NOR gate having inverted the logic level of an output signal thereof.

Second counter stage 8 is also, in a preferred embodiment, a divide-by-32 counter. Portions of the test circuit 50 associated with the second and succeeding counter stages are similar in nature and operation to that comprising portion 50-1 of the instant test circuit as has already been described above with reference to first counter stage 6. Therefore, the succeeding portions of the test circuit need not be described in detail. As illustrated, the high-speed clock input signal, provided by oscillator 1, is also supplied to input terminal 24 of portion 50-2 of test circuit 50.

Third counter stage 10 is also, in a preferred embodiment, a divide-by-32 counter. However, it is to be emphasized that the separate counter stages of the instant invention are not limited to divide-by-32 counters. Counter stages 6, 8 and 10 may divide down the frequency of a supply of high speed clock pulses by convenient like (as is shown in the figure) or unlike amounts. The high speed clock input signal, provided by oscillator 1, is also supplied to input terminal 34 of portion 50-3 of test circuit 50. Output terminal 38 of test circuit portion 50-3 is connected to the mode control logic of the display.

In operation, when it is desirable to place the test circuitry 50 into the TEST mode of operation in order to test the instant counter arrangement, a reset signal is first supplied from a reset means 48 to each of the counter stages 6, 8 and 10. The reset means 48 resets and clamps each counter stage 6, 8 and 10 to a known initial (e.g. zero) count until the reset signal is subsequently removed. Suitable relatively HI (i.e. that representative of a binary 1) enabling control signals are applied to TEST input terminals 18, 32 and 42 of portions 50-1, 50-2 and 50-3 of test circuit 50. Concurrently therewith, complementary relatively LOW (i.e. that representative of a binary 0) control signals are applied to NORMAL input terminals 16, 30 and 40. The output binary logic level signals from AND gate 12, and from the similar AND gates of the test circuit portions 50-2 and 50-3, are clamped relatively LOW during the TEST mode. The high speed oscillating clock input signal is applied to the first input terminal of AND gate 14 as well as to the input terminals 24 and 34 of the corresponding AND gates comprising test circuit portions 50-2 and 50-3. As a result thereof, the output logic level signals from AND gate 14, and like gates, have the frequency of the clock input signal. As in conventional logic techniques, NOR gate 20, and similar NOR gates comprising test circuit portions 50-2 and 50-3, transmit oscillating output logic level signals also having the frequency of the clock input signal (inasmuch as the output signals from AND gate 12 and the like gates comprising circuit portions 50-2 and 50-3 are clamped to a voltage, in the TEST mode, which is representative of a binary 0). Inverter gate 22, and like gates of circuit portions 50-2 and 50-3, provide oscillating logic level signals at the output terminals thereof which are inverted with respect to those logic level signals provided at the output terminals of NOR gate 20, and the like, in order to supply to counter stages 8 and 10 a signal having a frequency equivalent to that of the clock input signal. It should be recognized that, during the TEST mode of operation, each of the counter stages 6, 8 and 10 are interconnected with respect to one another through test circuit 50 so as to be concurrently operated in parallel by the same high speed clock input signal generated by oscillator amplifier 1. Therefore, by virtue of the instant counter and test circuit, a substantially reduced number of clock pulses is required to test the instant arrangement of counters 6, 8 and 10 as compared with prior art main counter arrangements which would otherwise reqiore require 32,000 clock pulses.

Upon removing the reset signal from counter stages 6, 8 and 10, the counter stages will begin to cycle. The output terminals 7, 9 and 11 of counter stages 6, 8 and 10, respectively, are connected to a conventional tester (not shown). The tester examines the counter output signals being supplied to the output driver, to the backplate driver and to the colon driver. The tester is programmed to compare the signals received from counter output terminals 7, 9 and 11 with a predetermined signal to determine if counter stages 6, 8 and 10 are functioning properly. Each counter stage 6, 8 and 10 of the instant embodiment counts in a 32 cycle mode and then resets itself to the known initial binary count.

In the NORMAL mode of operation, such as during the period when the timing device and display are being utilized, a relatively HI binary enabling control signal is applied to NORMAL input terminals 16, 30 and 40. Concurrently therewith, a complementary, relatively LOW binary signal is applied to TEST input terminals 18, 32 and 42. The output logic level signal from AND gate 14 and from those AND gates of test circuit portions 50-2 and 50-3, which are supplied to one input terminal of NOR gates 20 and to the like gates of circuit portions 50-2 and 50-3, is clamped relatively LOW during the NORMAL mode. The output terminals 7, 9 and 11 of counter stages 6, 8 and 10 are respectively connected to the first input terminal of AND gate 12 and to the input terminals 26 and 36 of similar AND gates comprising test circuit portions 50-2 and 50-3. The output signal from first counter stage 6 has a frequency which is equivalent to that of the clock input signal divided by a factor of 32 to 1024 Hz. As in the TEST mode of operation, the 1024 Hz. output signal is supplied to the first input terminal of AND gate 12 during the NORMAL mode. The output signal from second counter stage 8 has a frequency which is equivalent to that at the output terminal 7 of first counter stage 6 divided by a factor 32 to 32 Hz. The 32 Hz. output signal is supplied to an input terminal 26 of test circuit portion 50-2. An output terminal 28 of test circuit test portion 50-2 is connected to an input terminal of the third counter stage 10. The output signal from third counter stage 10 has a frequency which is equivalent to that at the output terminal 9 of second counter stage 6 divided down by a factor 32 to 1 Hz. The 1 Hz. output signal is supplied to an input terminal 36 of test circuit portion 50-3, as shown. The oscillating output logic level signals from AND gate 12, and like gates, which are supplied to a second input terminal of NOR gate 20 and to the like gates of circuit portions 50-2 and 50-3, will, therefore, have respective frequencies equivalent to that of the clock input signal, but divided down by a factor as determined by counter stages 6, 8 and 10, as described above.

As in conventional logic techniques, NOR gates 20, and similar NOR gates comprising test circuit portions 50-2 and 50-3, transmit oscillating output logic level signals having a frequency equivalent to the frequency of the signal supplied by respective counter output terminals 7, 9 and 11. However, the logic level of the signal generated at the output terminal of NOR gate 20, and the like gates, is inverted with respect to the logic level of the signal supplied from the output terminal of AND gate 12, and the like gates (inasmuch as the output signal from AND gate 14 and those gates comprising circuit portions 50-2 and 50-3 are, in the NORMAL mode, clamped to a voltage which is representative of a binary 0). Inverter gates 22, and the like gates of circuit portions 50-2 and 50-3, provide oscillating logic level signals at the output terminals thereof which are inverted with respect to those logic level signals provided at the output terminals of NOR gate 20, and the like, in order to drive the mode control logic and to operate the counter stages 8 and 10. It should be recognized that during the NORMAL mode of operation, each of the counter stages 6, 8 and 10 is interconnected with respect to one another through the instant test circuit 50 so as to be sequentially operated in a series circuit. Since the high speed clock input signal used to drive the counter stages of the instant invention during the TEST mode is disconnected during the NORMAL mode, the counter arrangement is equivalent to one large counter which divides the initial frequency of the input signal from oscillator 1 by 32,768 down to 1 Hz.

When it is desirable to test the logic comprising the test circuit 50 with the instant counter arrangement, counter stages 6, 8 and 10 are reset to their initial binary count by reset means 48. Counter stages 6, 8 and 10 are each concurrently driven in the TEST mode of operation by selectively applying suitable relatively HI enabling control signals to TEST input terminals 18, 32 and 42, as has already been disclosed. When each counter stage 6, 8 and 10 has counted up from its initial count by the equivalent of a decimal 32, the tester is programmed to cause the test circuit to switch out of the TEST mode and into 40 NORMAL mode of operation by applying a relatively HI enabling control signal to NORMAL input terminals 16, 30 and 4 and a relatively LOW control signal to TEST input terminals 18, 32 and 42 for one clock pulse, as provided by oscillator 1. The relatively LOW control signal applied to terminal 18 of AND gate 14 clamps the output signal thereof relatively LOW. The additional clock pulse will cause counter stage 6 to recycle to its initial count, and an output pulse is supplied from output terminal 7 thereof to the first input terminal of AND gate 12. A pulse corresponding to the output pulse from first counter stage 6 is transmitted from the output of AND gate 12 through the combination of NOR gate 20 and amplifier-inverter gate 22. An output pulse from amplifier-inverter gate 22 is supplied to an input terminal of second counter stage 8. Counter stage 8 is subsequently recycled to its initial count. By a similar means to that just described with reference to counter stage 6, a pulse is supplied from output terminals 9 and 11 to subsequently recycle third counter stage 10 and to drive the mode control logic. By monitoring the binary state of the logic level signals being transmitted to the output driver, the backplate driver, the colon driver and the mode control logic, the tester can determine if the logic which implements both the test circuit 50 and the counter arrangement of the instant invention are functioning properly.

By virtue of the instant one chip counter arrangement and high speed test circuit of the instant invention, the amount of logic and the number of pads on the semiconductor chip can be minimized (to one test pad) as compared with that required by conventional counter chips. Moreover, the counter stages 6, 8 and 10 can be tested in a substantially smaller time than that required to test the remainder of the chip. More particularly, the counter stages may be tested within thirty-three clock pulses as compared to approximately 32,000 clock pulses required by main counter arrangements of the prior art.

It will be apparent that while a preferred embodiment of the invention has been shown and described, various modifications and changes may be made without departing from the true spirit and scope of the invention.

Having thus set forth a preferred embodiment of the instant invention, what is claimed is:

1. An electronic counting circuit having means by which to test the accuracy of said circuit during a first mode of operation and to count the number of signals applied to said circuit during a second mode of operation, said counting circuit including:
   clock terminal means to receive a clock signal having an operating frequency,
   counter means comprising a plurality of divider stages, each of said stages having a respective input and output terminal thereof,
   said clock terminal means connected to the input terminal of a first of said divider stages,
   utilization means connected to the output terminal means of each of said divider stages and responsive to the frequency of the respective signals thereat in order to provide an indication as to the accuracy or the signal count of said counting circuit,
   control means connected between said clock terminal means and said counter means and adapted to selectively connect said clock terminal means to the respective input terminal of a second and succeeding ones of said plurality of divider stages in said first mode of operation so that each of said divider stages concurrently divides the operating frequency of said clock signal, and
   said control means adapted to selectively connect the output terminal of each of said plurality of divider stages to the input terminal of a succeeding one of said divider stages in said second mode of operation so that each of said divider stages successively divides the operating frequency of said clock signal.

2. The combination recited in claim 1, including reset means connected to each of said plurality of divider stages in order to reset each of said stages to an initial operating condition.

3. The combination recited in claim 1, wherein said control means is adapted to electrically connect each of said plurality of divider stages in a parallel circuit with respect to one another during said first mode of operation.

4. The combination recited in claim 1, wherein said control means is adapted to electrically connect each of said plurality of divider stages in a series circuit with respect to one another during said second mode of operation.

5. The combination recited in claim 1, including a high frequency signal source means connected to said clock terminal means to drive said counter means.

6. An electronic timing circuit including means to test said timing circuit and to provide an indication of time, said timing circuit including:
   counter means comprising a plurality of divider stages to be interconnected with respect to another, each of said divider stages having at least one input and output terminal thereof, clock terminal means connected to said at least one input terminal of a first of said plurality of divider stages, first and second control circuit means adapted to receive complementary control signals, said first control circuit means receiving a disabling control signal at a time when said second control circuit means receives a complementary enabling control signal to thereby selectively connect said clock terminal means to the input terminal of at least a second of said plurality of divider stages in order to test said timing circuit, said second control circuit means receiving a disabling control signal at a time when said first control circuit means receives a complementary enabling control signal to thereby selectively connect said at least one output terminal of said first divider stage to the input terminal of said second divider stage in order to provide an indication of time, and utilization means connected to said at least one output terminal of said divider stages and responsive to the signals thereat for testing said timing circuit or for indicating time.

7. The combination recited in claim 6, including clock signal generating means connected to said clock terminal means.

8. The combination recited in claim 7, wherein said clock signal generating means, said first and second control circuit means and said counter means are all disposed on a single semiconductor chip.

9. The combination recited in claim 6, wherein said utilization means includes a display means.

10. The electronic timing circuit recited in claim 6, wherein said first control circuit means receives a disabling control signal and the second control means receives a complementary enabling control signal in order that the first and at least the second of said plurality of divider stages are electrically interconnected in parallel with respect to one another, and said second control circuit means receives a disabling control signal and said first control circuit means receives a complementary enabling control signal in order that the first and at least the second of said plurality of divider stages are electrically interconnected in series with respect to one another.

* * * * *